United States Patent

Tempel

[19]

[11] Patent Number: 5,877,983
[45] Date of Patent: Mar. 2, 1999

[54] METHOD FOR SELECTIVE PROGRAMMING OF A NON-VOLATILE MEMORY

[75] Inventor: Georg Tempel, München, Germany

[73] Assignee: Siemens Aktiengesellschaft, Munich, Germany

[21] Appl. No.: 979,411

[22] Filed: Nov. 26, 1997

Related U.S. Application Data

[63] Continuation of PCT/DE96/00834, May 13, 1996, published as WO96/38847, Dec. 5, 1996.

[30] Foreign Application Priority Data

May 30, 1995 [DE] Germany .................. 195 19 774.7

[51] Int. Cl.$^6$ ..................................................... G11C 7/00
[52] U.S. Cl. .............. 365/185.18; 365/175; 365/185.23; 365/185.28
[58] Field of Search ................ 365/185.18, 185.23, 365/185.28, 175

[56] References Cited

U.S. PATENT DOCUMENTS 5,311,480  5/1994  Schreck .............................. 365/230.06
5,357,463  10/1994  Kinney .................................... 365/185
5,392,253  2/1995  Atsumi et al. ...................... 365/230.06
5,455,789  10/1995  Nakamura et al. ............. 365/185.23 X
5,610,858  3/1997  Iwahashi ............................. 365/185.23
5,654,920  8/1997  Watsuji et al. ................. 365/185.18 X
5,659,505  8/1997  Kobayashi et al. ................ 365/185.29

FOREIGN PATENT DOCUMENTS 0 456 623 A2  11/1991  European Pat. Off. .

OTHER PUBLICATIONS

"A 5-V-Only 16-Mb Flash Memory with Sector Erase Mode" (Jinbo et al.), 8107 IEEE Journal of Solid-State Circuits, No. 11, Nov. 27, 1992.

Primary Examiner—Do Hyun Yoo
Attorney, Agent, or Firm—Herbert L. Lerner; Laurence A. Greenberg

[57] ABSTRACT

A negative programming voltage is selectively applied to a word line of a nonvolatile memory by initially charging all of the word lines with the negative programming voltage. When the negative programming voltage is turned off, the word lines assume a floating state. Thereafter, a positive voltage is added to all the non-selected word lines in order to compensate for the negative charges.

3 Claims, 2 Drawing Sheets

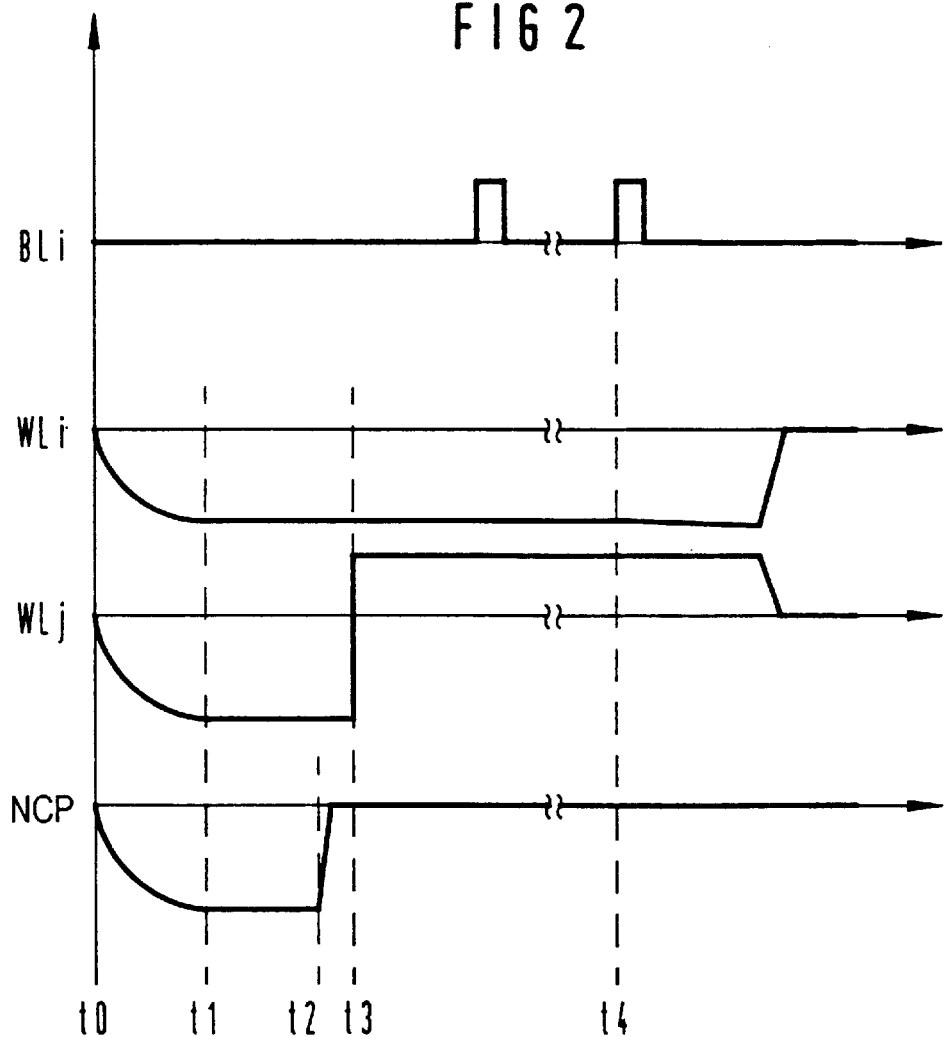

METHOD FOR SELECTIVE PROGRAMMING OF A NON-VOLATILE MEMORY

CROSS-REFERENCE TO RELATED APPLICATION

This is a continuation of copending international application PCT/DE96/00834, filed May 13, 1996, WO96/38847, Dec. 5, 1996, which designated the United States.

BACKGROUND OF THE INVENTION

FIELD OF THE INVENTION

Programmable non-volatile memory cells have a gate electrode which is in an electrically floating state, the so-called floating gate. The floating gate is isolated by insulating oxide layers both from the channel region of the memory cell, which in other respects is constructed like a MOSFET, and from the control gate electrode of the memory cell, and is arranged between them.

The cell is programmed by a charge applied to the floating gate. The inception voltage, i.e. the voltage at which the MOSFET forming the memory cell starts to conduct, is varied by this charge. When the cell is read, a voltage is applied to the control gate. That voltage has a value which is between the inception voltages of a non-programmed cell and a programmed cell. A logic "0" or a logic "1" is read out depending on whether a current flows as a result.

Until now, two methods have been known relating to how it is possible to apply the charges to the floating gate. In the first method, a high positive voltage of about 12 V is applied to the control gate, while typically about 7 V or 0 V, i.e. the normal operating voltages for MOS circuits, is added to the drain and the source of the MOSFET which forms the memory cell. In consequence, a powerful current flows through the channel of the MOSFET, from which so-called "hot" electrons pass to the floating gate.

In the second method, a high negative voltage of about −12 V is applied to the control gate and a voltage of about 5 V is applied to the drain. In consequence, holes tunnel through the gate oxide to the floating gate and charge it positive. As a result, the inception voltage of the MOSFET which forms the memory cell falls.

The latter method admittedly has the advantage that no leakage current flows through the channel during charging of the floating gate. However, it raises the problem of having to switch a high negative voltage selectively to the word line to be selected. A conventional n-channel MOSFET cannot be used here, since its n-doped drain region or source region would form a virtual short circuit to the p-doped substrate, which is connected to ground, on application of a negative voltage.

It is therefore conventional to arrange n-channel MOSFETs for this purpose in a p-doped well laid through a deep n-doped well. Additional technology outlay is involved here, however, special equipment such as high-energy implanters and the risk of possible charges on the insulated well and gate-oxide stress linked thereto during the processing.

European patent publication EP 0 456 623 A2 discloses another solution. There, the high negative voltage is connected to the word line of a non-volatile memory via p-channel MOSFETs. While the p-MOSFETs can be produced using conventional technology, they require a negative gate voltage for switching. This is produced by voltage inverter circuits from a positive high voltage. However, the voltage inverter circuits are required for each word line, which necessitates considerable circuitry complexity.

A method is described in U.S. Pat. No. 5,311,480 to Schreck wherein a positive voltage is added to all selected word lines through an insulation element. At the same time, only the selected word line is pulled to a negative potential with a charge pump associated therewith. This, however, results in relatively great current consumption.

SUMMARY OF THE INVENTION

It is accordingly an object of the invention to provide a method for selective programming of a non-volatile memory, which overcomes the above-mentioned disadvantages of the heretofore-known devices and methods of this general type and which allows selective application of a negative programming voltage to a word line of a non-volatile memory.

With these objects in view there is provided, in accordance with the invention, a method for selective application of a negative programming voltage to a word line of a nonvolatile memory. The method comprises the following sequence of steps:

selecting a word line from a plurality of word lines of a non-volatile memory;

applying a negative programming voltage to the plurality of word lines;

switching off the negative programming voltage and causing the word lines to assume a floating state; and applying a positive voltage to all non-selected word lines of the plurality of word lines.

In accordance with an added feature of the invention, the negative programming voltage is added to the word lines via diodes. In accordance with a preferred embodiment, the diodes are formed with PMOS transistors.

In other words, the negative voltage is applied to all word lines simultaneously. This is done, for example, via a respective PMOS transistor connected as a diode. Thus, no selective switching of the high negative voltage is necessary. This results in simplification of the technology and circuitry in the non-volatile memory chip, since only standard circuit techniques are required. In addition, only one standard technology is required, since no special insulation of the substrate with respect to negative voltages is necessary.

An individual word line is selected in accordance with the invention by compensation of the negative charges on all non-selected word lines. This is done by application of a positive voltage to the word lines, i.e. a voltage which is present anyway.

Switching of positive voltages does not result in any problems of the above-mentioned type.

Other features which are considered as characteristic for the invention are set forth in the appended claims.

Although the invention is illustrated and described herein as embodied in method for selective programming of a non-volatile memory, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 2 shows a timing diagram illustrating the method according to the invention.

DESCRIPTION OF THE PREFERRED EMBODIMENTS

Figure 1:
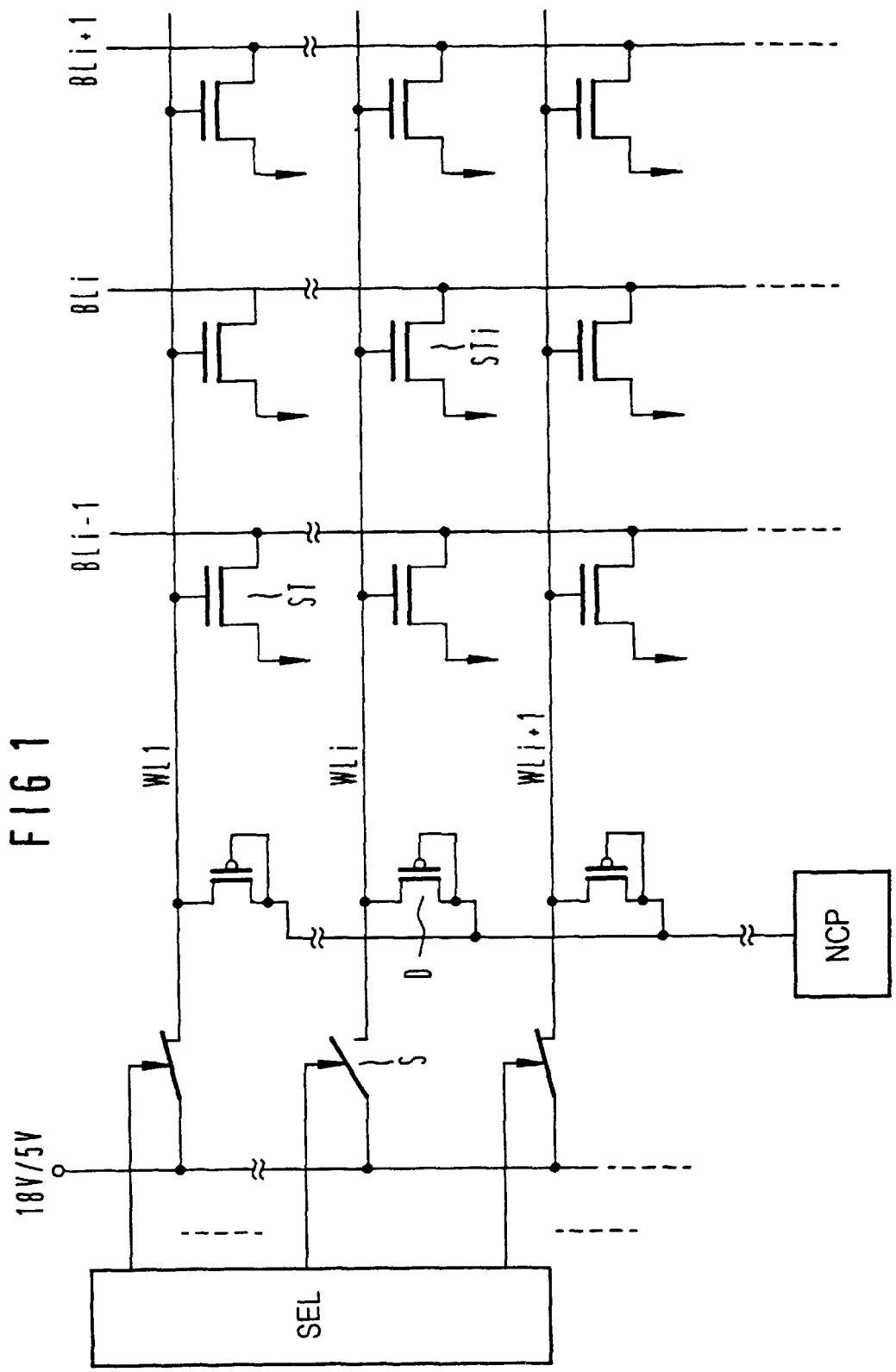
FIG. 1 shows a schematic illustration of a nonvolatile memory for carrying out the method according to the invention.

Referring now to the figures of the drawing in detail and first, particularly, to FIG. 1 thereof, there is seen a schematic of a non-volatile memory with a memory cell area with memory cells ST arranged in rows and columns. The memory cells ST can be selected via word lines WL1 . . . WLi, WLi+1 . . . and bit lines . . . BLi−1, BLi, BLi+1 . . . , in order to be programmed, erased and read. In order to program a specific memory cell STi, a high negative programming voltage must be added to the corresponding word line WLi, and the normal positive supply voltage for MOS circuits of, for example, about 5 V must be added to the corresponding bit line BLi. The high negative voltage is produced by a negative charge pump NCP, and is applied simultaneously to all word lines WL1 . . . WLi, WLi+1 . . . via diodes D, which are formed by PMOS transistors. All the word lines WL1 . . . WLi, WLi+1 . . . can be connected via switches S to a high positive voltage of, for example, about 18 V or to the supply voltage of, for example, about 5 V. The switches S can be actuated by a circuit configuration SEL for selection of a word line. They can be formed, for example, by CMOS inverters.

FIG. 2 shows the timing sequence of the method according to the invention. The negative charge pump NCP is switched on at a time t0. It reaches the required high voltage of about −12 V at a time t1. The voltage is applied simultaneously via the diodes D to all the word lines WL1 . . . WLi, WLi+1 . . . , so that they are charged to the negative voltage value. This is illustrated in FIG. 2 for the selected or chosen word line WLi and for the non-selected word lines WLj. The negative charge pump NCP is switched off at time t2. The switches S of all the non-selected word lines WLj are then closed at a time t3 which follows t2 after a short interval, so that the word lines WLj are connected to a positive voltage and the negative charges located on them are thus compensated for. As a result of the diodes D, these positive charges have no influence on the selected word line WLi, so that it retains its negative charge. The self-discharge time of the thus negatively charged word line WLi may be a number of seconds so that sufficient time is available to apply programming pulses to the selected bit line or lines BLi in order to program the selected memory cell or cells STi. After the last programming pulse has been applied to the bit line BLi at time t4, the programming process is complete and the word lines WLi and WLj are changed to a neutral state.

I claim:

1. A method for selective application of a negative programming voltage to a word line of a nonvolatile memory, which comprises the following sequential steps:

selecting the word line from a plurality of word lines of the nonvolatile memory;

applying the negative programming voltage to the plurality of word lines;

switching off the negative programming voltage and causing the word lines to assume a floating state; and applying a positive voltage to all non-selected word lines of the plurality of word lines.

2. The method according to claim 1, wherein the step of applying the negative programming voltage comprises adding the negative programming voltage to the word lines via diodes.

3. The method according to claim 2, wherein the diodes are formed with PMOS transistors.

* * * * *